(12) United States Patent
Han et al.

(10) Patent No.: US 6,429,532 B1
(45) Date of Patent: Aug. 6, 2002

(54) PAD DESIGN

(75) Inventors: Charlie Han, Hsinchu Hsien; Kai-Kuang Ho, Feng-Shan, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/567,843

(22) Filed: May 9, 2000

(51) Int. Cl.[7] .......................... H01L 29/40; H01L 23/48
(52) U.S. Cl. ..................... 257/781; 257/737; 257/780
(58) Field of Search .................... 257/737, 738, 257/777, 778, 780, 786, 758, 784, 48, 781; 438/11, 14, 15, 18

(56) References Cited

U.S. PATENT DOCUMENTS

| | | | | |
|---|---|---|---|---|
| 5,262,719 A | * | 11/1993 | Magdo | 324/158 R |
| 5,684,304 A | * | 11/1997 | Smears | 257/48 |
| 5,793,117 A | * | 8/1998 | Shimada et al. | 257/780 |
| 5,834,844 A | * | 11/1998 | Akagawa et al. | 257/734 |
| 5,838,023 A | * | 11/1998 | Goel et al. | 257/48 |
| 6,013,537 A | * | 1/2000 | Kuchta | 438/18 |
| 6,153,448 A | * | 11/2000 | Takahashi et al. | 438/114 |

\* cited by examiner

Primary Examiner—Jasmine J B Clark
(74) Attorney, Agent, or Firm—J.C. Patents

(57) ABSTRACT

A pad design. The pad design provides an additional testing pad that is electrically connected to a conventional bonding pad and positioned beside the bonding pad. The conventional bonding pad is formed on a provided chip, and a bump is formed on the bonding pad. A final test is performed on the testing pad so that damage formed on the bump or on the bonding pad can be prevented.

8 Claims, 2 Drawing Sheets

PAD DESIGN

BACKGROUND OF THE INVENTION

1. Field of the Invention

The invention relates in general to a package structure for semiconductor integrated devices, and more particularly to a pad design for flip chip package of semiconductor integrated devices.

2. Description of the Related Art

The manufacture of an integrated circuit (IC) can be roughly divided into three separate stages: the manufacture of a silicon chip, the production of an integrated circuit on the silicon chip and the packaging of the silicon chip. Hence, the packaging of the silicon chip can be regarded as the final stage in the integrated circuit fabrication process. A conventional IC package is used to package a single chip. However, in order to increase the capacity of a memory package, for example, or to integrate silicon chips having different functions, many packages now contain two silicon chips.

In general, in an IC package having two silicon chips, the silicon chips are mounted on the upper and lower sides of the lead frame. However, if the circuit layout of the two silicon chips is the same, two pieces of identical DRAM chips are used to increase memory capacity, and the metal wires that connect the bonding pads on the silicon chips with the lead frame may have to cross over each other, leading to a certain degree of entanglement with each other. The bonding pads are also used as testing points for wafer testing. For connecting silicon chips to other devices, bumps are usually formed as connecting mediums on the bonding pads.

FIG. 1 is a schematic diagram showing a conventional package structure. In the figure, a silicon chip 100 having a bonding pad 102 is provided. Bump 104 is formed on the bonding pad 102. There is a protection layer 106 formed over the chip 100 but no over the bonding pad 102. After finishing the package structure, a final test must be performed to ensure that the semiconductor device is workable. The final test can be performed either before or after forming the bump 104 on the bonding pad 102. However, if the final test is performed after bumping, a test probe 108 would directly contact the bump 104. The acute probe 108 may damage the bump 104. Furthermore, the acute probe 108 can not easily contact the global bump 104, so over-kill doesn't occur during testing. Whereas, if the final test is performed before bumping, failure occuring between the bonding pad 102 and the bump 104 cannot be detected. Also, the test probe 108 would directly contact the bonding pad 102 and cause a probe mark on the bonding pad 102, which affects reliability when forming the bump 108.

SUMMARY OF THE INVENTION

The invention provides a pad design. A final test can be performed after bumping without damaging the bump on the bonding pad. The pad design of the invention provides an additional testing pad that is electrically connected to a conventional bonding pad and positioned beside the bonding pad. The conventional bonding pad is formed on a provided chip, and a bump is formed on the bonding pad. A final test is performed on the testing pad so that damage formed on the bump or on the bonding pad can be prevented.

According to the pad design of the invention, a conventional probe card used for testing still can be used without any modifications. Furthermore, the final test is performed on the testing pad so that no probe mark would be formed either on the bonding pad or on the bump. Since there is no bump formed on the testing pad, the test probe can easily touch the testing pad without over-kill.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The invention provides a pad design. A final test can be performed after bumping without damaging a bump on a bonding pad. The pad design of the invention provides an additional testing pad that is electrically connected to a conventional bonding pad and positioned beside the bonding pad. The conventional bonding pad is formed on a provided chip, and a bump is formed on the bonding pad. A final test is performed on the testing pad so that damage formed on the bump or on the bonding pad can be prevented.

Figure 1:
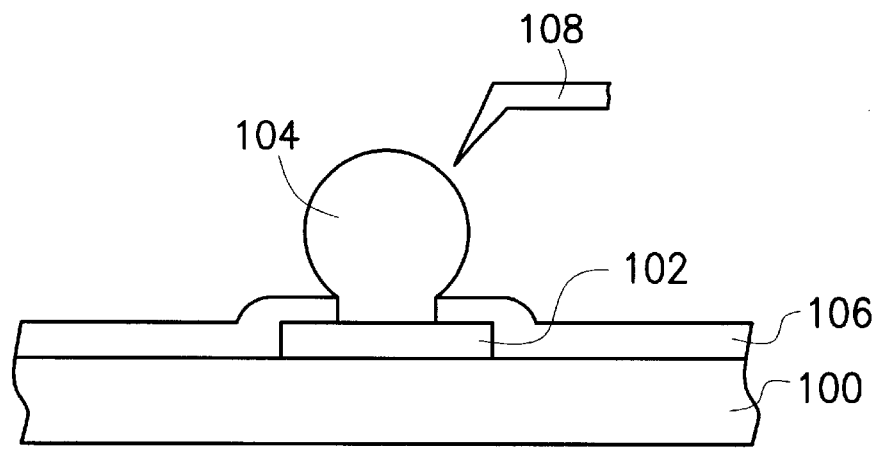
FIG. 1 is a schematic diagram showing a structure of a conventional semiconductor device package.
Figure 2:
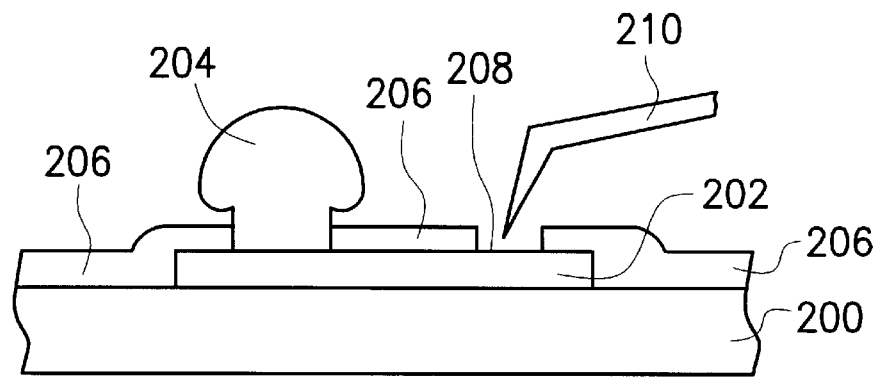
FIG. 2 is a schematic diagram showing a structure of a pad design of a first preferred embodiment of the invention.

FIG. 2 is a schematic diagram showing a structure of a pad design of a first preferred embodiment of the invention. A chip 200 is provided. A bonding pad 202 is formed on the chip 200. A protecting layer 206 is formed over the chip 200 and exposes two portions of the bonding pad 202. One exposed portion of the bonding pad 202 electrically contacts a bump 204. Another exposed portion of the bonding pad 202 is used as a testing pad 208. When performing a wafer level test, a probe 210 is put on the testing pad 208 for testing.

Figure 3:
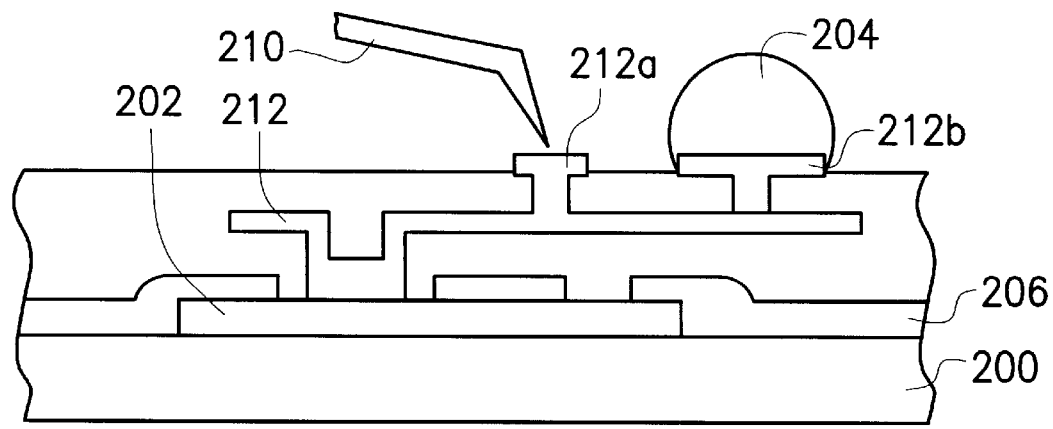
FIG. 3 is a schematic diagram showing a structure of a pad design of a second preferred embodiment of the invention.

FIG. 3 is a schematic diagram showing a structure of a pad design of a second preferred embodiment of the invention. In the structure shown in FIG. 3, a redistributed layer (RDL) 212 is formed between the bonding pad 202 and the bump 204. A protecting layer (not shown) is formed over the bonding pad 202 and the RDL 212. The RDL 212 is electrically connected to the bonding pad 202. Two portions 212a, 212b of the RDL 212 are not covered by the protecting layer. One of the two portions 212a, 212b of the RDL 212 is used as a testing pad. Another one of the two portions 212a, 212b of the RDL 212 is used as a bonding pad for bumping.

Figure 4:
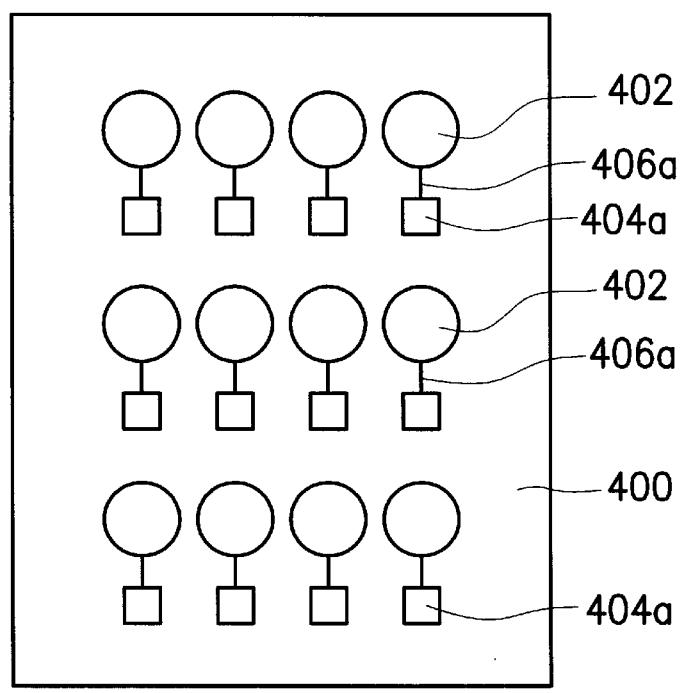
FIG. 4 is a schematic diagram showing a top view of the pad design layout of the invention.

FIG. 4 is a schematic diagram showing a top view of the pad design layout of the invention. There are bumps 402 arrayed in the center of a provided chip 400. Testing pads 404a are formed beside each of the bumps 402. Wiring lines 406a connect the testing pads 404a and the bumps 402. In a conventional pad design, there is no testing pad formed beside the bump 402 so that a test probe would directly contact the bump and damage it when performing the final test. However, in the invention, the damage caused by the testing probe can be prevented.

Figure 5:
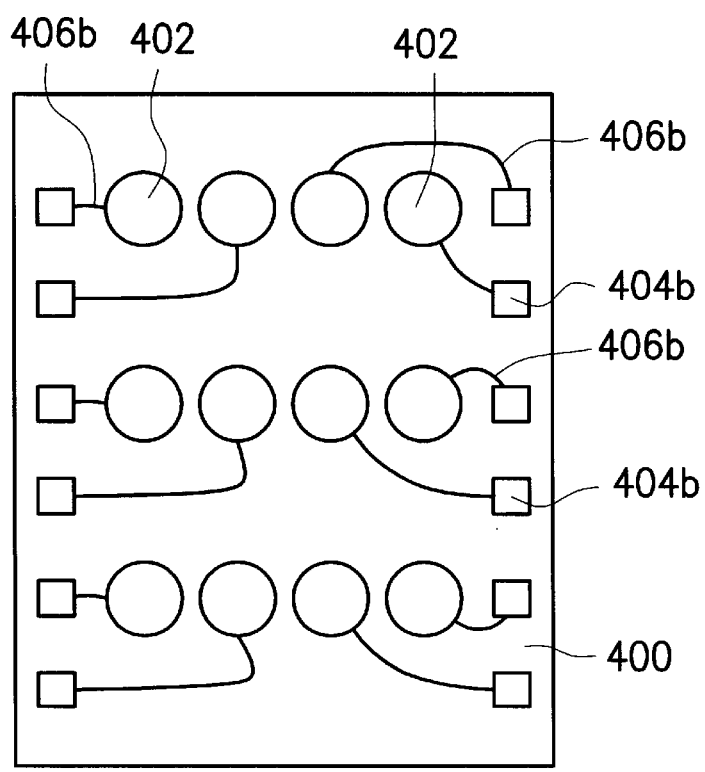
FIG. 5 is a schematic diagram showing another top view of the ad design layout of the invention.

FIG. 5 is a schematic diagram showing another top view of the pad design layout of the invention. The testing pads 404b are positioned on two sides of the chip 400. The bumps 402 array is in the center of the chip 400. Wiring lines 406b electrically connect the testing pad 404b to the bump 402. The layout of the testing pads 404b shown in FIG. 5 is the same as a conventional testing pad layout so that a conventional probe card can still be used without the need to design a new probe card.

According to the pad design of the invention, a conventional probe card used for testing still can be used without any modification. Furthermore, the final test is performed on the testing pad so that no probe marks are formed either on the bonding pad or on the bump. Since there are no bumps formed on the testing pad, the test probe can easily touch the testing pad without over-kill. Thus, wafer level testing can be performed either before bumping or after bumping.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pad design, comprising:
   a chip, having at least a bonding pad on an active surface of the chip;
   a protecting film over the active surface of the chip, exposing at least two different portions of the bonding pad; and
   a bump formed on one of the exposed portions of the bonding pad, with the other exposed portion of the bonding pad being used as a testing pad.

2. The pad design according to claim 1, wherein a material of the bonding pad comprises aluminum.

3. The pad design according to claim 1, wherein a material of the bump comprises copper.

4. The pad design according to claim 1, wherein the chip comprises a plurality of bonding pads, and a plurality of bumps and testing pads respectively formed on the bonding pads in a manner that the bumps are centrally arranged in array and the testing pads are distributed at a periphery of the chip.

5. The pad design according to claim 4, wherein each of the bonding pad comprises a testing pad positioned beside each of the bumps.

6. A pad design, comprising:
   a chip, having at least a bonding pad on an active surface of the chip;
   a redistributed layer formed on the active surface of the chip, wherein a portion of the redistributed layer electrically contacts the bonding pad;
   a protecting layer, exposing a first region and a second region of the redistributed layer; and
   a bump positioned on the first region of the redistributed layer, and the second region of the redistributed layer is used as a testing pad.

7. The pad design according to claim 6, wherein a material of the bump comprises copper.

8. The pad design according to claim 6, wherein a thickness of the redistributed layer between the first region and the second region is less than 10 $\mu$m.

* * * * *